United States Patent [19]

Risko

[11] 4,110,488
[45] Aug. 29, 1978

[54] METHOD FOR MAKING SCHOTTKY BARRIER DIODES

[75] Inventor: John Joseph Risko, Cranbury, N.J.

[73] Assignee: RCA Corporation, New York, N.Y.

[21] Appl. No.: 675,638

[22] Filed: Apr. 9, 1976

[51] Int. Cl.² .................. H01L 21/66; H01L 29/48
[52] U.S. Cl. ............................ 427/84; 148/1.5;
   148/177; 357/15; 427/8; 427/38; 427/85;
   427/93; 427/383 D
[58] Field of Search .................. 357/15; 427/84, 93,
   427/85, 8, 38, 383 D; 148/1.5, 177

[56] References Cited

U.S. PATENT DOCUMENTS

| 3,290,127 | 12/1966 | Kahng et al. | 357/15 |
|---|---|---|---|
| 3,496,631 | 2/1970 | Chen | 29/577 |
| 3,579,278 | 5/1971 | Heer | 357/15 |
| 3,841,904 | 10/1974 | Chiang | 427/84 |
| 3,849,789 | 11/1974 | Cordes et al. | 357/15 |
| 3,900,344 | 8/1975 | Magdo | 427/84 |
| 4,056,642 | 11/1977 | Saxena et al. | 357/15 |

*Primary Examiner*—John D. Smith
*Attorney, Agent, or Firm*—H. Christoffersen; R. P. Williams; D. S. Cohen

[57] ABSTRACT

A plurality of Schottky barrier devices are produced by a method which uses a relationship between barrier height, surface concentration of impurities, and alloying time valid when a thin layer of oxide is present on a device substrate and includes the steps of preselecting an impurity concentration for the principal surface of a plurality of silicon substrates and using a predetermined alloying time for each substrate to achieve a preselected barrier height.

9 Claims, 10 Drawing Figures

METHOD FOR MAKING SCHOTTKY BARRIER DIODES

The present invention relates to a method of making a Schottky barrier, and more particularly, to a method of producing a metal silicide layer on the surface of a body of silicon. The novel method is particularly directed to producing Schottky barrier diodes using thinly oxidized silicon substrates wherein each diode is produced with substantially the same barrier height.

A Schottky barrier diode is a semiconductor device having a metal silicide layer to semiconductor surface barrier rectifying junction. Such diodes generally comprise a metal film coated directly on a surface of a body of a silicon semiconductor. A characteristic of a Schottky barrier diode that affects certain operating properties of the diode, such as the leakage current under reverse bias and the turn-on voltage, is the Schottky barrier height. The Schottky barrier height is a difference, in electron volts, between the Fermi energy level and the conduction band energy level in the semiconductor at the metal to semiconductor surface barrier junction.

In the manufacture of a plurality of circuits which incorporate Schottky barrier devices, an essential requirement is that these circuits operate consistently with respect to each other. Consistent operating characteristics of Schottky barriers imply that the leakage current and turn-on characteristic of these devices are similar. Provided the Schottky barrier height of each device of the plurality is the same, the reverse biased leakage currents will be equal or substantially the same, and the turn-on voltages will be equal or substantially the same.

Another problem which has been considered particular to the formation and manufacture of Schottky barriers is an acute need for cleanliness of the silicon substrate. Cleanliness herein refers to a condition where the substrate is free of a natural oxide. In this art, a practice has been to take great care to insure that the silicon substrate is free of oxides before a Schottky metal is deposited. The deposition of the Schottky metal upon an oxide adjacent a silicon substrate has heretofore produced inferior Schottky barriers. An inferior Schottky barrier is a barrier having barrier height substantially below 0.86 eV. Hence, a production of a Schottky barrier on an oxide coated substrate is known to produce a Schottky barrier with a substantially lowered barrier height.

At present there also exists a need in this art for a method for the manufacture of Schottky barrier devices without having to use expensive and tedious cleaning procedures on the substrate to prevent an oxide formation prior to the barrier formation. It is recognized that there is no problem forming the metal silicide with the oxide present. The problem is the diminished height of the Schottky barrier so formed.

Many have proposed producing Schottky barrier diodes by sputtering a metal layer onto a clean oxide-free surface of silicon material or by depositing the metal by evaporation in an evacuated ambient. This was particularly pointed out by Myron J. Rand in an article entitled "Chemical Vapor Deposition of Thin Film Platinum," *Journal of Electrochemical Society*, May 1973, pps. 686-692. There it is indicated that when platinum is deposited on a silicon substrate, the platinum is interdiffused with the silicon in selected areas, forming platinum silicide contacts to the underlying silicon. The doping level of the silicon substrate is declared to control whether the platinum forms an ohmic diode or a Schottky diode.

It has also been proposed to control or select the series resistance of a Schottky barrier diode by a selected grading of the net impurity concentration in the epitaxial layer of the diode from a minimum value at the principal surface of the silicon substrate adjacent the diode junction to a maximum value at the other principal surface of the silicon substrate in accordance with various profiles. Suitable profiles are indicated as one-step, multistep, and continuously graded. This proposition is set forth in U.S. Pat. No. 3,849,789 issued to Cordes et al., November 19, 1974.

Also known is that occasionally when a metal silicide layer is formed on an oxide coated silicon substrate a Schottky barrier also formed exhibits a desired barrier height of 0.86 eV. However, such a barrier height has heretofore been a matter of chance and not reproducible.

In prior art methods, wherein the thin natural oxide of silicon on the surface of the silicon substrate is removed the height of a Schottky barrier formed between a metal silicide layer and the substrate is not proportional to the alloying time or the surface concentration. The barrier heights are consistently 0.86 for barriers formed on clean substrates. Thus, it is suggested that the surface concentration of a clean substrate has no effect on the barrier height.

This novel invention includes the discovery that the barrier height of Schottky barrier devices can be consistently controlled by the surface impurity concentration of a silicon semiconductor substrate provided a natural oxide is allowed to remain on the surface thereof, all other processing factors being the same.

It is a further discovery of this invention that there exists a relationship between the barrier height of a Schottky barrier formed on a silicon substrate having a thin oxide thereon wherein the Schottky barrier is between an alloyed metal silicide layer formed on the oxide and interspersed into the oxide whereby the metal silicide layer also contacts the silicon substrate. This relationship is a direct proportionality between the ratio of the barrier height raised to the fourth power and the product of the surface concentration of free conductivity modifiers in the silicon substrate and the square root of the alloying time and is valid as long as the number of available moles of the Schottky metal at the surface of the oxide is substantially the same. This relationship is used as a part of the novel method to consistently reproduce Schottky barriers having substantially the same preselected barrier height.

In theory, the novel method applies to any procedure for the formation of a Schottky barrier wherein either silicon ions or Schottky metal ions diffuse through a natural interstitial space in an oxide layer on a silicon substrate and wherein metal silicide molecules are formed adjacent the oxide layer which molecules subsequently diffuse back through an interstitial space of the oxide layer to form another kind of metal silicide layer.

Figure 1:
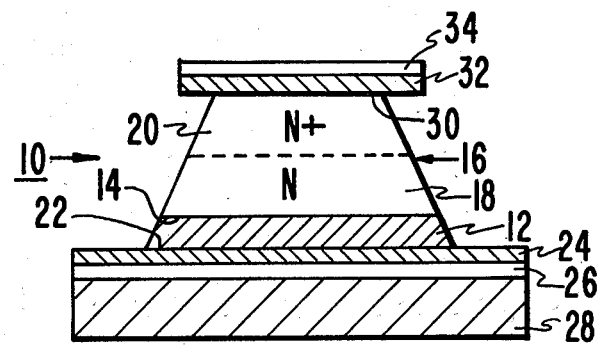
FIG. 1 is a cross-sectional view illustrating the metal layers and the semiconductor layers of a Schottky barrier diode made by the novel method.

Referring to FIG. 1, there is shown one embodiment of a Schottky barrier diode 10. The diode 10 comprises a metal silicide layer 12, having a thickness of between 50 A and 200 A, on a surface 14 of a monocrystalline semiconductor substrate 16, such as arsenic or phosphorous doped silicon. The substrate 16 is comprised of a moderately doped N layer 18 having a thickness between 1 and 5 micrometers and a donor concentration of approximately $10^{16}$ atoms-cm$^{-3}$ and a heavily doped N$^+$ layer 20 having a donor concentration of approximately $10^{19}$ atoms-cm$^{-3}$. The substrate 16 in the present example may have a surface 14 oriented parallel to either the (100) or the (111) crystal plane of the silicon.

The N$^+$ layer 20 in the present example is approximately 250 micrometers thick and exhibits a resistivity of approximately 0.01 ohm-cm. The N layer 18 has a resistivity of approximately 0.2 ohm-cm.

In practice, a surface 22 of the metal silicide layer 12 is metallized, for example, with successive layers of chromium, gold, and copper, specifically shown, respectively, in FIG. 1 as layers 24, 26, and 28. The surface 30 of the N$^+$ layer 20 is also metallized as with successive layers of chromium and gold, illustrated in FIG. 1 as layers 32 and 34, respectively. The chromium, gold, and copper layers are deposited in a known manner.

One aspect of the novel method is predicated upon an equation expressing a relationship between the barrier height $\phi_b$, of a Schottky barrier, the time $t$, required for formation of the metal silicide layer which creates the Schottky barrier of the device, and the free carrier density $N_o$ at the surface of the substrate upon which the metal silicide layer is formed. The equation is valid and applicable as long as the number of moles of available Schottky metal at an oxide surface remains approximately fixed.

This equation may be written as $$N_o t^{\frac{1}{2}} = K\phi_b^n$$

where K is an empirical constant.

When platinum is used to form the metal silicide layer 12 experiments have indicated that $n$ is substantially equal to 4.

Another aspect of the novel method includes the steps of: (a) selecting or forming a surface concentration density $N_o$, as by ion implantation or diffusion, for the N/N$^+$ doped silicon substrate 16 at the surface 14 thereof; (b) forming a thin natural oxide of silicon on the surface 14 of the substrate 16 onto which a Schottky metal is to be disposed; (c) depositing a Schottky metal; (d) applying heat to the Schottky metal and the silicon substrate 16 for a time duration $t$; (e) separating the silicon substrate 16 into individual diodes 10 such as shown in FIG. 1 and determining the measured barrier height $\phi_m$ and the constant $k$; (f) adjusting the alloying time to $t'$ wherein $t'$ is determined by the equation $t' = (k\phi_m^n/N_o)^2$, where $n = 4$ for platinum; (g) repeating the processing steps for making the diode 10 using $t'$ for the preselected time $t$ wherein the number of moles of available Schottky remains the same.

Instead of selecting or forming a free carrier concentration density $N_o$ for the entire surface 14 of the silicon semiconductor substrate 16, it is also within the contemplation of the novel method to select particular portions of the surface 14 having a density $N_o$ from measurements made thereon. Thus, some portions of the surface 14 may be suitably masked, as with a suitable known photoresist by using photolithographic techniques and only the unmasked portions of the surface 14 used for the manufacture of the Schottky barrier diodes.

In the novel method, the presence of the thin layer of natural oxide adjacent the silicon on the surface of the silicon substrate is a significant factor in determining the value of the barrier height of the metal silicide-silicon interface formed. Therefore, during the alloying process, whereby the metal silicide layer is formed by application of heat to the Schottky metal and the silicon substrate, both a diffusion mechanism wherein the Schottky metal and the silicon commingle and a charge related effect due to a presence of the oxide and impurity ions at the silicon-metal interface, affect the formation of the metal silicide. A magnitude for the charge related effect is further determined by the number of impurity ions present at the surface of the silicon substrate. This number is directly related to the free carrier concentration at the surface and controlling this surface concentration $N_o \equiv N_d - N_a$ accordingly controls the barrier height of the metal silicide formed. ($N_d$ and $N_a$ are, respectively, the donor and acceptor concentrations.)

In practice, the metal silicide layer 12 is produced on the surface 14 of the silicon substrate 16 by the novel method as follows.

An N$^+$ substrate is first cut from an N$^+$ boule. The N$^+$/N silicon substrate 16 illustrated in FIG. 2 may be formed by any of several known techniques, for example, epitaxial formation of the N layer, solid or gaseous diffusion, or ion implantation.

Figure 2:
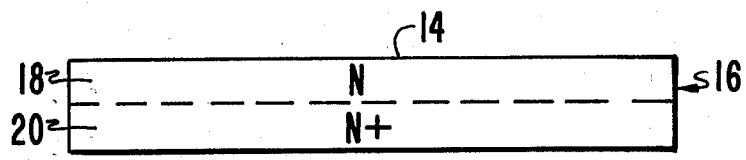
FIG. 2 shows a cross-sectional view of a semiconductor substrate upon which the various steps of the present invention may be performed.

The N layer of the N$^+$/N substrate in FIG. 2 is preferably made by epitaxial growth. However, the N layer may be formed by counter-doping an uppermost layer and principal surface of the substrate. For example, an arsenic or phosphorous N$^+$ substrate may be counter doped N by diffusing or implanting a prespecified amount of boron. The density $N_o$ may be made to arise from the N material for the layer 18 by a shallow ion implantation into the substrate 16 a small depth for example, 0.5 micrometers. In particular, for a surface concentration of $1.6 \times 10^{16}$ free impurity atoms of N material per cm$^2$, an ion implantation machine may be appropriately set by known techniques to provide a flux of $0.4 \times 10^{17}$ ions of boron per minute to an N$^+$ substrate having an N$^+$ substrate having an initial concentration of $5.6 \times 10^{17}$ free impurity atoms of phosphorous per cm$^3$. Exposure to the ion flux for 13.6 minutes set at a sufficient energy, for example 30 kev, to penetrate the surface of the substrate produces a surface concentration of $1.6 \times 10^{16}$ free impurity atoms/cm$^2$.

When the N layer 18 in FIG. 2 is formed by epitaxis, the N$^+$ layer 20 is typically formed by ion implanting phosphorous at 70 KeV, for example, into a major surface of the substrate 16. The major surface typically has a free impurity concentration from $10^{15}$ to $10^{16}$ atoms/cm$^3$ initially. The free concentration is increased to approximately $10^{17}$ atoms/cm$^3$ to form the N$^+$ layer 20.

The surface 14 of the substrate 16 is cleaned by any known cleaning technique for removing contaminants Alternately, the density $N_o$ may be made N for the layer 18 by deposition of a doped oxide adjacent the substrate 16 and the subsequent thermal diffusion of impurities from the oxide into the surface 14 of the substrate 16 to a depth, for example, of 0.5 micrometer or less, by thermally heating the coated substrate in an argon atmosphere at a temperature of 1130° C. for approximately 45 minutes. In this manner, the density $N_o$ of the surface 14 becomes substantially equal to the free carrier concentration density of the doped oxide, the doped oxide concentration density being known and preselected in accordance with known techniques.

Subsequently the doped oxide is removed by a known etchant.

Figure 3:
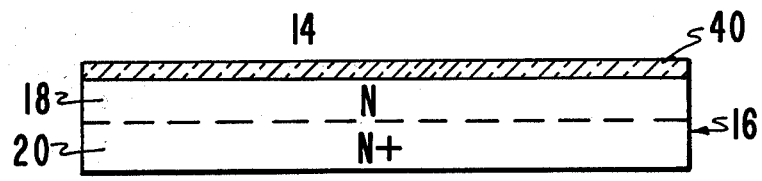
FIGS. 3–10 show cross-sectional views of the substrate of FIG. 2 after selected steps of the present invention.

Thereafter, a thin layer 40 of natural oxide between 10 A and 500 A thick is formed on the cleaned substrate by briefly exposing to an oxidizing atmosphere for 2 milliseconds for example, at 27° C. (see FIG. 3). The substrate 16 is next stored in ethyl alcohol, for example, until it is prepared for formation of the metal silicide layer thereon by removal from the alcohol and drying.

Figure 4:
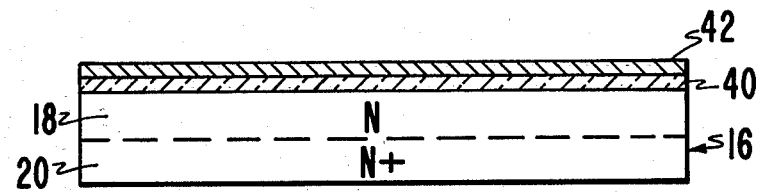

Next, as illustrated in FIG. 4 a Schottky metal layer 42 is disposed adjacent the layer 40. The layer 42 preferably comprises elemental platinum in a resin medium such as, for example, platinum film 6032 manufactured by Emulsitone Co., 41 East Willow Street, Millburn, New Jersey.

Provided the number of moles of available platinum, the Schottky metal, remains the same from one processing sequence to another, the equation supra provides an accurate prediction of $\phi$. Hence, Platinum films having therein different concentrations of platinum metal will produce a different empirical constant K. Thus, it is important herein in the practice of this invention to insure that the available concentration of the Schottky metal remains approximately the same after K is determined. Otherwise, a family of equations is created, one having a K corresponding to each metal concentration. This factor is particularly notable in the use of new and used (or old) bottles of platinum film 6032. The moles which are consumed during processing do not effect the constant K.

It is theorized that the number of moles of available platinum is decreased either by slow evaporation of the medium or a chemical reaction among the constituents of the medium and the platinum. Wafers processed in a timespan of one week had barriers heights which fitted one equation.

Typically, the ethyl alcohol in which the substrate has been stored is dried from the substrate 16 by spinning at 3000 rpm for approximately 2.5 seconds, for example. The platinum film 6032 is typically applied by spinning the substrate 15 at a preselected rate and by concurrently applying a preselected amount of the film. The surface of the substrate 15 is flooded with the platinum film 6032 by use of an eye dropper and then spun again at 3000 rpm for 2.5 seconds. The spinner is stopped, flooded again with the platinum film 6032, and spun at 3000 rpm for 15 seconds, for example, A third coat of the platinum film 6032 is applied and the wafer is spun for 15 seconds, for example at 3000 rpm. Usually the resin in the platinum film is permitted to dry by a suitable means such as placement on a hot plate or in a hot box preset to a temperature of 150° C. for 1 minute. This measure insures that any excess solvent at the surface of the wafer is removed.

The Schottky metal layer 42 and the silicon substrate 16 are subjected to known alloying conditions for a selected arbitrary time, $t$, which alloys portions of the layer 42 through interstitial molecular spaces in the oxide of the surface 14. The unalloyed portions of the layer 42 are separated from the silicon substrate 16 by the oxide layer 40. It is theorized that silicon molecules from the substrate 16 diffuse up through oxide layer 40 to the metal layer 42 where $Pt_2Si$ is initially formed. The $Pt_2Si$ molecules then breakdown into PtSi molecules which diffuse back through the natural interstitial molecular spaces in the oxide layer 40 to form a PtSi-Si interface at the substrate. Alternatively, it may be theorized that during alloying the Pt molecules diffuse through the oxide molecular spaces where, upon contact with the silicon, $Pt_2Si$ is initially formed and later transformed into PtSi at the substrate.

Figure 5:
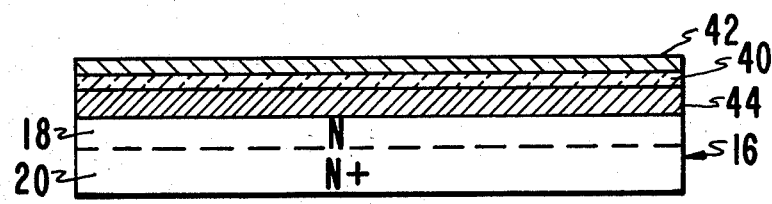

FIG. 5 illustrates the substrate 16 after alloying. There is shown the platinum layer 42 adjacent the substrate 16; a platinum silicide layer 44 adjacent the substrate 16; and the oxide layer 40 above the platinum silicide layer 44.

Figure 6:
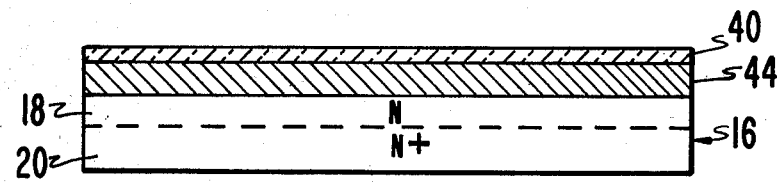
Figure 7:
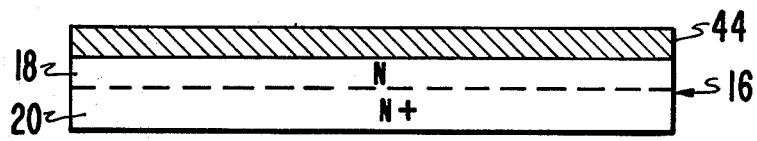

Alloying may, for example, comprise baking the substrate 16 with the layers 40 and 42 affixed thereto at approximately 350° C. in an atmosphere such as forming gas for approximately 15 minutes, for example. Therefore, the substrate 16 is usually annealed for an additional time, $t$, at 650° C. as specified by the equations herein. The platinum layer 42 is then removed from the substrate 16 (FIG. 6). Next, the oxide layer 40 is removed (FIG. 7). The layer 42 may be removed by known means such as immersion in a solution such as aqua regia, at a temperature of 27° C. for approximately 2 minutes.

Thereafter, the substrate 16 is cleaned such as by rinsing in ethyl alcohol.

Figure 8:
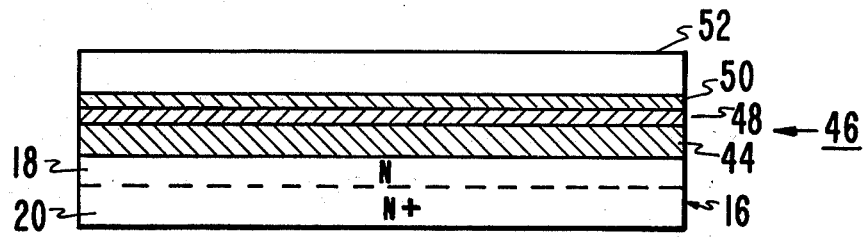

Metal contacts, comprised of chrome and gold layers, are applied to the silicide layer 44 of the structure 46 by a suitable known means. Typically, a layer 48 of chromium is deposited adjacent the silicide layer 44 by a vapor deposition of chromium (FIG. 8). A layer 50 of gold may also be disposed adjacent the layer 48 by a suitable known means, such as, for example, vapor deposition or sputtering.

Next, a thick layer 52 of copper, for example, is deposited by known means adjacent the layer 50. The copper layer 52 provides a heat sink for the device.

A substantial portion of the thickness of the substrate 16 is no longer desired nor is it necessary for the completion of the Schottky barrier device shown in FIG. 1. The thickness of the silicon substrate 16 may be reduced by any suitable known means. Chemical etching and ion milling are examples. Typically, the thickness of the wafer 16 comprising the structure 46 shown in FIG. 8, is reduced by immersion of the structure 46 into a solution of 97% $HNO_3$ — 3% HF at a temperature of approximately 27° C. for about 30 to 45 minutes.

Figure 9:
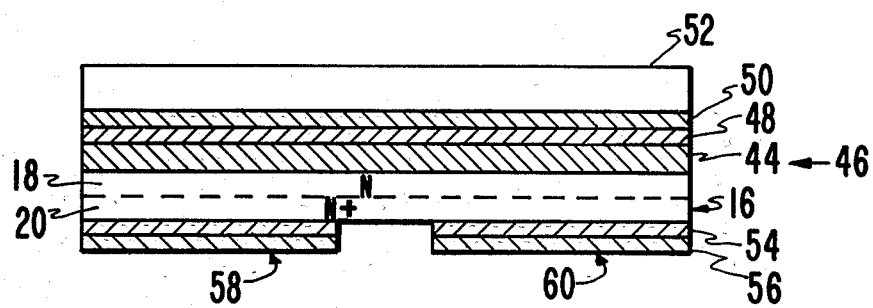
Figure 10:
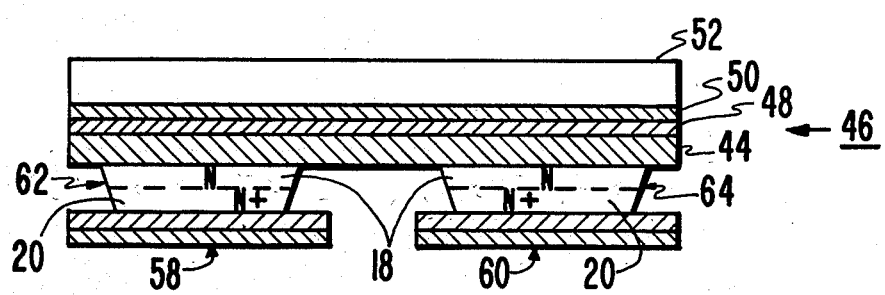

Thereafter, layers 54 and 56 of chromium and gold, respectively, suitably apertured to provide select etch masks are disposed, by suitable means known within this art, adjacent the substrate 16 of the structure 46 (FIG. 9). Schottky barrier mesa diodes are formed from the structure 46 by removing the silicon by chemical etching using contacts 58 and 60 as etch masks. Individual mesa diodes 62 and 64 are formed with the contacts 58 and 60, respectively, thereon (FIG. 10).

The structure 46, comprising a plurality of mesa diodes 62 and 64, is separated into individual diodes by etching suitable grooves in the copper layer 52. Although not illustrated, this may be accomplished by means known within this art, for example, a layer of photoresist may be photolithographically defined adjacent the exposed principal surface of the layer 52 and etched accordingly. Once the layer 52 is etched through, the individual diodes may be physically separated by breaking each away.

The constant, $k$, of the equation $$N_o t^{\frac{1}{2}} = k\phi_m^n$$

is determined with respect to a preselected $t$ and measured $\phi_m$ using measured current-voltage and capacitance-voltage characteristics. Two transcendental equations wherein $k$ and $n$ are unknown and the product $N_o t^{\frac{1}{2}}$ is known and different for each equation may be generated. For example, using logarithms, the equations may be expressed as $$\ln k + n\ln\phi m_1 = \ln N_o t_1^{\frac{1}{2}}$$

$$\ln k + n\ln\phi m_2 = \ln N_o t_2^{\frac{1}{2}}$$

and $n$ may be determined from these equations by simple algebraic means.

According to the novel equation of the invention, assuming $\phi_m$ is not equal to $\phi_b$, a preselected and desired barrier height, the alloying time $t$ is reselected as $t'$ and the processing steps are repeated using $t'$. The reselected time, $t'$, is determined from the above equation, all other parameters and variables in the equation being known.

The above calibration steps are repeated on another substrate as manufacturing steps with the exception of the determination of the constant $k$. In using the steps for manufacturing the Schottky metal is alloyed to the silicon substrate 16 for the reselected time $t'$. The measured barrier height, $\phi_m$ of the devices produced in the second series of steps will be approximately equal to the desired preselected barrier height $\phi_b$.

What is claimed is:

1. A method for making a Schottky barrier device comprising the steps of:
    forming a thin layer of a natural oxide of silicon adjacent the principal surface of a substrate of silicon;
    forming a layer of a Schottky metal adjacent said oxide layer; and
    heating the Schottky metal layer and the substrate at a selected temperature, the temperature being sufficient to form a metal silicide whereby a metal silicide layer is formed between said substrate and said oxide layer, and thereafter removing said oxide layer whereby said metal silicide layer is exposed.

2. The method as recited in claim 1 wherein prior to forming the layer of the Schottky metal adjacent the oxide layer a conductivity type imparting impurity concentration for the principal surface of the substrate is selected by ion implanting a known amount of impurities into the principal surface.

3. The method as recited in claim 1 wherein prior to forming the layer of Schottky metal adjacent the oxide layer a conductivity type imparting impurity concentration for the principal surface of the substrate is selected by diffusing a known amount of the impurities into the principal surface.

4. The method as recited in claim 3 wherein the impurities are diffused from a doped oxide adjacent the principal surface.

5. The method as recited in claim 1 wherein the Schottky metal is platinum.

6. In a method for making a plurality of Schottky barrier diodes comprising the steps of:
    preselecting a Schottky barrier height, $\phi_b$;
    selecting a first amount of a Schottky metal;
    placing the first selected amount of the Schottky metal above a principal surface of a first silicon substrate;
    alloying the Schottky metal to the first substrate wherein a first Schottky metal silicide layer is formed adjacent the first substrate having a first barrier height;
    selecting a second amount of a Schottky metal;
    placing the second selected amount of the Schottky metal above a principal surface of a second silicon substrate having a second barrier height;
    the improvement comprising the additional steps of:
    forming conductivity type imparting impurity atoms of a selected free carrier concentration equally on the principal surfaces of the first and second substrates;
    forming similar thin layers of a natural oxide of silicon adjacent the principal surfaces of the first and second silicon substrates prior to the placement of the Schottky metal above said principal surfaces;
    selecting and using a first time duration for alloying the Schottky metal to the first substrate;
    determining the actual barrier height of the first Schottky metal silicide layer; and
    selecting and using a second time duration for alloying the Schottky metal to the ground substrate determined by an equation $t' = k\phi_b^n/N_o$ where $t'$ is the second time duration, $N_o$ is the concentration of the impurity atoms at the principal surfaces, $n$ is equal to 4 for platinum as the Schottky metal, and $k$ is a constant determined by the above equation wherein the actual barrier height for the first metal silicon layer is substituted for the preselected barrier height, $\phi_b$.

7. The method of claim 6 wherein the Schottky metal is platinum.

8. The method of claim 6 wherein the impurity atoms of a selected concentration are formed by disposing a doped oxide of a known impurity concentration adjacent the principal surfaces and heating.

9. The method of claim 6 wherein the impurity atoms of a selected concentration are formed by ion implanting like ions of a known flux density into the principal surfaces.

* * * * *